(12) United States Patent
Testi et al.

(10) Patent No.: US 10,992,278 B2
(45) Date of Patent: *Apr. 27, 2021

(54) MULTI-STAGE LNA WITH REDUCED MUTUAL COUPLING

(71) Applicant: Innophase, Inc., San Diego, CA (US)

(72) Inventors: Nicolo Testi, San Diego, CA (US);
Yang Xu, San Diego, CA (US)

(73) Assignee: INNOPHASE INC., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/811,883

(22) Filed: Mar. 6, 2020

(65) Prior Publication Data
US 2020/0280293 A1    Sep. 3, 2020

Related U.S. Application Data

(63) Continuation of application No. 16/125,480, filed on Sep. 7, 2018, now Pat. No. 10,622,959.

(51) Int. Cl.
*H03B 1/00*    (2006.01)
*H03G 5/28*    (2006.01)
(Continued)

(52) U.S. Cl.
CPC ............. *H03G 5/28* (2013.01); *H03B 5/1265* (2013.01); *H03B 5/1287* (2013.01); *H03H 7/09* (2013.01);
(Continued)

(58) Field of Classification Search
CPC ........... H03H 11/1291; H03H 11/1217; H03H 11/06; H03H 7/09; H03G 5/28;
(Continued)

(56) References Cited

U.S. PATENT DOCUMENTS

| 4,271,412 A | 6/1981 | Glass et al. |
| 4,322,819 A | 3/1982 | Hyatt |
| 5,325,095 A | 6/1994 | Vadnais et al. |

(Continued)

FOREIGN PATENT DOCUMENTS

| CN | 103795406 A | 5/2014 |
| EP | 1187313 A1 | 3/2002 |

(Continued)

OTHER PUBLICATIONS

Wiser, Robert F., et al., "A 5-GHz Wireless LAN Transmitter with Integrated Tunable High-Q RF Filter", IEEE Journal of Solid-State Circuits, vol. 44, No. 8, Aug. 2009, 2114-2125 (12 pages).

(Continued)

*Primary Examiner* — Long Nguyen
(74) *Attorney, Agent, or Firm* — Invention Mine LLC

(57) ABSTRACT

A low noise amplifier includes at least two variable gain amplifier stages, each variable gain amplifier configured to accept an input signal and to provide a load driving signal; a tunable bandpass filter connected as a load to each variable gain amplifier stage, wherein each bandpass filter includes a resonant tank, each resonant tank including an inductor, wherein each inductor of each resonant tank is oriented in orthogonal relation with respect to each respective longitudinal axis of each next inductor, the orthogonal relation of the respective longitudinal axes configured to reduce mutual coupling between the tunable bandpass filters; a cross-coupled transistor pair, and at least one cross-coupled compensation transistor pair biased in a subthreshold region configured to add a transconductance component as a function of a load driving signal; and, a controller circuit configured to tune each tunable bandpass filter.

16 Claims, 13 Drawing Sheets

(51) Int. Cl.
   *H03B 5/12* (2006.01)
   *H03H 7/09* (2006.01)
   *H03H 11/06* (2006.01)

(52) U.S. Cl.
   CPC ....... *H03H 11/06* (2013.01); *H03F 2200/294* (2013.01); *H03F 2200/372* (2013.01)

(58) Field of Classification Search
   CPC .......... H03F 3/211; H03F 3/602; H03F 3/191; H03F 2200/372; H03F 2200/294; H03B 5/1287; H03B 5/1265
   See application file for complete search history.

(56) References Cited

U.S. PATENT DOCUMENTS

| | | |
|---|---|---|
| 5,493,581 A | 2/1996 | Young et al. |
| 5,635,864 A | 6/1997 | Jones |
| 6,161,420 A | 12/2000 | Dilger et al. |
| 6,369,659 B1 | 4/2002 | Delzer et al. |
| 6,373,337 B1 | 4/2002 | Ganser |
| 6,556,636 B1 | 4/2003 | Takagi |
| 6,587,187 B2 | 7/2003 | Watanabe et al. |
| 6,975,165 B2 | 12/2005 | Lopez et al. |
| 7,042,958 B2 | 5/2006 | Biedka et al. |
| 7,095,274 B2 | 8/2006 | Lopez et al. |
| 7,193,462 B2 | 3/2007 | Braithwaite |
| 7,313,198 B2 | 12/2007 | Rahman et al. |
| 7,332,973 B2 | 2/2008 | Lee et al. |
| 7,400,203 B2 | 7/2008 | Ojo et al. |
| 7,447,272 B2 | 11/2008 | Haglan |
| 7,453,934 B2 | 11/2008 | Seppinen et al. |
| 7,564,929 B2 | 7/2009 | Lopez et al. |
| 7,602,244 B1 | 10/2009 | Holmes et al. |
| 7,773,713 B2 | 8/2010 | Cafaro et al. |
| 7,888,973 B1 | 2/2011 | Rezzi et al. |
| 8,314,653 B1 | 11/2012 | Granger-Jones et al. |
| 8,368,477 B2 | 2/2013 | Moon et al. |
| 8,390,349 B1 | 3/2013 | Ravi et al. |
| 8,421,661 B1 | 4/2013 | Jee et al. |
| 8,498,601 B2 | 7/2013 | Horng et al. |
| 8,666,325 B2 | 3/2014 | Shute et al. |
| 8,774,748 B2 | 7/2014 | Casagrande et al. |
| 8,787,511 B2 | 7/2014 | Brunn et al. |
| 8,804,875 B1 | 8/2014 | Xu et al. |
| 8,854,091 B2 | 10/2014 | Hossain et al. |
| 8,929,486 B2 | 1/2015 | Xu et al. |
| 8,941,441 B2* | 1/2015 | Testi ...................... H03G 3/008 330/254 |
| 9,024,696 B2 | 5/2015 | Li et al. |
| 9,083,588 B1 | 7/2015 | Xu et al. |
| 9,178,691 B2 | 11/2015 | Shimizu et al. |
| 9,240,914 B2 | 1/2016 | Yao |
| 9,391,625 B1 | 7/2016 | Xu et al. |
| 9,479,177 B1 | 10/2016 | Buell et al. |
| 9,497,055 B2 | 11/2016 | Xu et al. |
| 9,519,035 B2 | 12/2016 | Ramirez |
| 9,673,828 B1 | 6/2017 | Xu et al. |
| 9,673,829 B1 | 6/2017 | Xu et al. |
| 9,813,011 B2 | 11/2017 | Despesse |
| 9,813,033 B2 | 11/2017 | Testi et al. |
| 9,819,524 B2 | 11/2017 | Khoury et al. |
| 9,853,843 B2 | 12/2017 | Talty et al. |
| 9,985,638 B2 | 5/2018 | Xu et al. |
| 10,122,397 B2 | 11/2018 | Xu et al. |
| 10,148,230 B2 | 12/2018 | Xu et al. |
| 10,158,509 B2 | 12/2018 | Xu et al. |
| 10,320,403 B2 | 6/2019 | Xu et al. |
| 10,622,959 B2* | 4/2020 | Testi ...................... H03B 5/1215 |
| 2001/0001616 A1 | 5/2001 | Rakib et al. |
| 2002/0048326 A1 | 4/2002 | Sahlman |
| 2002/0132597 A1 | 9/2002 | Peterzell et al. |
| 2003/0053554 A1 | 3/2003 | McCrokle et al. |
| 2003/0058036 A1 | 3/2003 | Stillman et al. |
| 2003/0142002 A1 | 7/2003 | Winner et al. |
| 2003/0174783 A1 | 9/2003 | Rahman et al. |
| 2004/0036538 A1 | 2/2004 | Devries et al. |
| 2004/0100330 A1 | 5/2004 | Chandler |
| 2004/0146118 A1 | 7/2004 | Talwalkar et al. |
| 2005/0285541 A1 | 12/2005 | Lechevalier |
| 2006/0078079 A1 | 4/2006 | Lu |
| 2006/0145762 A1 | 7/2006 | Leete |
| 2006/0193401 A1 | 8/2006 | Lopez et al. |
| 2006/0222109 A1 | 10/2006 | Watanabe et al. |
| 2006/0285541 A1 | 12/2006 | Roy |
| 2007/0132511 A1 | 6/2007 | Ryynänen et al. |
| 2008/0069514 A1 | 3/2008 | Son et al. |
| 2008/0079497 A1 | 4/2008 | Fang et al. |
| 2008/0112526 A1 | 5/2008 | Yi |
| 2008/0150645 A1 | 6/2008 | McCorquodale et al. |
| 2008/0170552 A1 | 7/2008 | Zaks |
| 2008/0192872 A1 | 8/2008 | Lindoff |
| 2008/0192877 A1 | 8/2008 | Eliezer et al. |
| 2008/0205709 A1 | 8/2008 | Masuda et al. |
| 2008/0211576 A1 | 9/2008 | Moffatt et al. |
| 2008/0220735 A1 | 9/2008 | Kim et al. |
| 2008/0225981 A1 | 9/2008 | Reddy et al. |
| 2008/0225984 A1 | 9/2008 | Ahmed et al. |
| 2008/0291064 A1 | 11/2008 | Johansson et al. |
| 2009/0153244 A1 | 6/2009 | Cabanillas et al. |
| 2009/0256601 A1 | 10/2009 | Zhang et al. |
| 2009/0295493 A1 | 12/2009 | Lee et al. |
| 2009/0302908 A1 | 12/2009 | Nakamura |
| 2010/0303047 A1 | 12/2010 | Ibrahim et al. |
| 2011/0003571 A1 | 1/2011 | Park et al. |
| 2011/0019657 A1 | 1/2011 | Zaher |
| 2011/0050296 A1 | 3/2011 | Fagg |
| 2011/0140737 A1 | 6/2011 | Rivoir |
| 2011/0159877 A1 | 6/2011 | Kenington et al. |
| 2011/0260790 A1 | 10/2011 | Haddad |
| 2011/0298557 A1 | 12/2011 | Kobayashi |
| 2011/0299632 A1 | 12/2011 | Mirzaei et al. |
| 2011/0300885 A1 | 12/2011 | Darabi et al. |
| 2012/0032718 A1 | 2/2012 | Chan et al. |
| 2012/0074990 A1 | 3/2012 | Sornin |
| 2012/0256693 A1 | 10/2012 | Raghunathan et al. |
| 2012/0306547 A1 | 12/2012 | Arora et al. |
| 2013/0143509 A1 | 6/2013 | Horng et al. |
| 2013/0257494 A1 | 10/2013 | Nikaeen et al. |
| 2014/0023163 A1 | 1/2014 | Xu |
| 2014/0133528 A1 | 5/2014 | Noest et al. |
| 2014/0185723 A1 | 7/2014 | Belitzer |
| 2014/0266454 A1 | 9/2014 | Testi et al. |
| 2014/0266480 A1 | 9/2014 | Li et al. |
| 2014/0269999 A1 | 9/2014 | Cui et al. |
| 2014/0270003 A1 | 9/2014 | Xu et al. |
| 2014/0321479 A1 | 10/2014 | Zhang et al. |
| 2015/0180685 A1 | 6/2015 | Noest et al. |
| 2015/0207499 A1 | 7/2015 | Horng et al. |
| 2015/0229318 A1 | 8/2015 | Tamura et al. |
| 2016/0074224 A1 | 3/2016 | Scheller et al. |
| 2016/0139568 A1 | 5/2016 | Schimper |
| 2016/0155558 A1 | 6/2016 | Groves et al. |
| 2016/0169717 A1 | 6/2016 | Zhitomirsky |
| 2017/0085405 A1 | 3/2017 | Xu et al. |
| 2017/0163272 A1 | 6/2017 | Xu et al. |
| 2017/0187364 A1 | 6/2017 | Park et al. |
| 2017/0194973 A1 | 7/2017 | Moehlmann |
| 2018/0196972 A1 | 7/2018 | Lu et al. |
| 2018/0205384 A1 | 7/2018 | Lee |
| 2018/0287646 A1 | 10/2018 | Xu et al. |
| 2019/0059055 A1 | 2/2019 | Murali |
| 2020/0083857 A1 | 3/2020 | Testi et al. |

FOREIGN PATENT DOCUMENTS

| | | |
|---|---|---|
| EP | 1187313 B1 | 2/2008 |
| JP | H07221570 A | 8/1995 |
| JP | H1188064 A | 3/1999 |
| JP | 2012134981 A | 7/2012 |
| KR | 20150007728 A | 1/2015 |

(56) References Cited

FOREIGN PATENT DOCUMENTS

| WO | 2005078921 A2 | 8/2005 |
|---|---|---|
| WO | 2005078921 A3 | 4/2006 |
| WO | 2012132847 A1 | 10/2012 |

OTHER PUBLICATIONS

Yu, Jianjun, et al., "A 3-Dimensional Vernier Ring Time-to-digital Converter in 0.13 μm CMOS", Electrical and Computer Engineering, Auburn University, Auburn AL, Sep. 19, 2010, 1-4 (4 pages).
International Search Report and Written Opinion for PCT/US2014/029055, dated Sep. 15, 2014, 1-12 (12 pages).
International Search Report and Written Opinion for PCT/US2016/053484, dated Dec. 19, 2016, 1-8 (8 pages).
International Search Report and Written Opinion for PCT/US2016/064772, dated Feb. 28, 2017, 1-7 (7 pages).
International Preliminary Report on Patentability for PCT/US2018/027222 completed Apr. 4, 2019, dated Jun. 20, 2019, 1-3 (3 pages).
International Search Report and Written Opinion for PCT/US2014/030525, dated Jul. 24, 2014, 1-16 (16 pages).
International Search Report and Written Opinion for PCT/US2014/026459, dated Jul. 28, 2014, 1-10 (10 pages).
International Search report and Written Opinion for PCT/US20/12607, dated May 7, 2020, 1-17 (17 pages).
International Search Report and Written Opinion of the International Searching Authority for PCT/US13/024159, dated Apr. 9, 2013, 1-8 (8 pages).
International Search Report and Written Opinion for PCT/US2019/067237, dated Apr. 24, 2020, 1-14 (14 pages).
International Search Report and Written Opinion for PCT/US2019/049493, dated Apr. 29, 2020, 1-10 (10 pages).
International Search Report and Written Opinion for PCT/US2019/057432, dated Apr. 6, 2020, 1-9 (9 pages).
International Preliminary Report on Patentability for PCT/US2016/064772, dated Jun. 14, 2018, 1-6 (6 pages).
International Search report and Written Opinion for PCT/US18/27222, dated Jun. 28, 2018, 1-6 (6 pages).
Aeroflex, "Measurement of Frequency Stability and Phase Noise", Application Note, Part No. 46891/865, Issue 1, Feb. 2007, 1-8 (8 pages).
Betancourt-Zamora, Rafael, et al., "1-GHz and 2.8-GHz CMOS Injection-Locked Ring Oscillator Prescalers", Allen Center for Integrated Systems, Stanford University, Conference Paper, Feb. 2001, 1-5 (5 pages).
Buckel, Tobias, et al., "A Highly Reconfigurable RF-DPLL Phase Modulator for Polar Transmitters in Cellular RFICs", IEEE Transactions on Microwave Theory and Techniques, vol. 66, No. 6, Jun. 2018, 2618-2627 (10 pages.
Chen, Chi-Tsan, et al., "Cognitive Polar Receiver Using Two Injection-Locked Oscillator Stages", IEEE Transactions on Microwave Theory and Techniques, vol. 59, No. 12, Dec. 2011, 3484-3493 (10 pages).
Chen, Chi-Tsan, et al., "Wireless Polar Receiver Using Two Injection-Locked Oscillator Stages for Green Radios", IEEE MTT-S International, Jun. 2011, 1-4 (4 pages).
Cheng, Jiao, et al., "A 1.3mW 0.6V WBAN-Compatible Sub-Sampling PSK Receiver in 65nm CMOS", IEEE International Solid-State Circuits Conference, ISSCC Session 9.6, Feb. 11, 2014, 168-170 (3 pages).
Chien, Jun-Chau, et al., "Analysis and Design of Wideband Injection-Locked Ring Oscillators With Multiple-Input Injection", IEEE Journal of Solid-State Circuits, vol. 42, No. 9, Sep. 2007, 1906-1915 (10 pages).
Darvishi, Milad, et al., "A 0.3-to-1.2GHz Tunable 4th-Order Switched gm-C Bandpass Filter with >55dB Ultimate Rejection and Out-of-Band IIP3 of +29dBm", 2012 IEEE International Solid-State Circuits Conference, Session 21.1, 2012, 358-360 (3 pages).
Dudek, Piotr, et al., "A High-Resolution CMOS Time-to-Digital Converter Utilizing a Vernier Delay Line", IEEE Transactions on Solid-State Circuits, vol. 35, No. 2, Feb. 2000, 240-247 (8 pages).
Effendrik, Popong, "Time-to-Digital Converter (TDC) for WiMAX ADPLL in State-of-The-Art 40-nm CMOS", MSc Theses, Delft University of Technology, Apr. 18, 2011, 1-80 (80 pages).
Frantz, Claude, "Frequency Discriminator", DJ0OT, 1994, 1-7 (7 pages).
He, Xin, et al., "A 2.5-GHz Low-Power, High Dynamic Range, Self-Tuned Q-Enhanced LC Filter in SOI", IEEE Journal of Solid-State Circuits, vol. 40, No. 8, Aug. 2005, 1618-1628 (11 pages).
He Xin et al., "A Fully Integrated Q-enhanced LC Filter with 6 dB Noise Figure at 2.5 GHz in SOI", IEEE Radio Frequency Integrated Circuits Symposium, 2004, 643-646 (4 pages).
Henzler, S., "Time to Digital Converters", Springer Series in Advanced Microelectronics 29, Chapter 2, Springer Science+Business Media B.V., 2010, 5-19 (15 pages).
Hewlett Packard, "Phase Noise Characterization of Microwave Oscillators", Frequency Discriminator Method, Product Note 11729C-2, Sep. 1985, 1-45 (45 pages).
Jovanovic, G.S., et al., "Vernier's Delay Line Time-to-Digital Converter", Scientific Publications of the State University of Novi Pazar, Ser. A: Appl. Math. Inform. and Mech., vol. 1, 1, 2009, 11-20 (10 pages).
Li, Dandan, et al., "Design Techniques for Automatically Tuned Integrated Gigahertz-Range Active LC Filters", IEEE Journal of Solid-State Circuits, vol. 37, No. 8, Aug. 2002, 967-977 (11 pages).
Liao, Dongyi, et al., "An 802.11a/b/g/n Digital Fractional-N PLL With Automatic TDC Linearity Calibration for Spur Cancellation", IEEE Journal of Solid-State Circuits, 0018-9200, Jan. 16, 2017, 1-11 (11 pages).
Lin, Chin-Hsin, et al., "Single-Stage Vernier Time-to-Digital Converter with Sub-Gate Delay Time Resolution", Scientific Research, Circuits and Systems, vol. 2, Oct. 2011, 365-371 (7 pages).
Liscidini, Antonio, et al., "Time to Digital Converter based on a 2-dimensions Vernier architecture", University of Pavia, IEEE Custom Integrated Circuits Conference, Sep. 13, 2009, 1-4 (4 pages).
López-Villegas, José María, et al., "BPSK to ASK Signal Conversion Using Injection-Locked Oscillators—Part I: Theory", IEEE Transactions on Microwave Theory and Techniques, vol. 53, No. 12, Dec. 2005, 3757-3766 (10 pages).
Markulic, Nereo, et al., "A self-calibrated 10Mb/s phase modulator with −37.4dB EVM based on a 10.1-to-12.4GHz, −246.6dB-FOM, fractional-n subsampling PLL", IEEE International Solid-State Circuits Conference (ISSCC), San Francisco, Session 9.7, 2016, 176-178 (3 pages).
Marzin, Giovanni, et al., "A 20Mb/s Phase Modulator Based on a 3.6GHz Digital PLL with −36dB EVM at 5 mW Power", IEEE International Solid-State Circuits Conference, vol. 47, No. 12, Dec. 2012, 2974-2988 (15 pages).
Mirzaei, Ahmad, et al., "Multi-Phase Injection Widens Lock Range of Ring-Oscillator-Based Frequency Dividers", IEEE Journal of Solid-State Circuits, vol. 43, No. 3, Mar. 2008, 656-671 (16 pages.
Nazari, Peyman, "Polar Quantizer for Wireless Receivers: Theory, Analysis, and CMOS Implementation", IEEE Transactions on Cricuits and Systems, vol. 61, No. 3, Mar. 2014, 1-94 (94 pages).
O'Brien, Paul, "A Comparison of Two Delay Line Discriminator Implementations for Low Cost Phase Noise Measurement", Analog Devices Raheen Business Park Limerick Ireland, 2010, 1-11 (11 pages).
Pellerano, Stefano, et al., "A 4.75-GHz Fractional Frequency Divider-by-1.25 With TDC-Based All-Digital Spur Calibration in 45-nm CMOS", IEEE Journal of Solid-State Circuits, vol. 44, No. 12, Dec. 2009, 3422-3433 (12 pages).
Putnam, William, et al., "Design of Fractional Delay Filters Using Convex Optimization", IEEE ASSP Workshop on Applications of Signal Processing to Audio and Acoustics (CCRMA), Stanford University, 1997, 1-5 (5 pages).
Rategh, Hamid R., et al., "Superharmonic Injection Locked Oscillators as Low Power Frequency Dividers", Stanford University, Symposium on VLSI Circuits, Digest of Technical Papers, Jun. 1998, 1-4 (4 pages).

(56) References Cited

OTHER PUBLICATIONS

Razavi, Behzad, "A Study of Injection Pulling and Locking in Oscillators", Electrical Engineering Department, University of California, IEEE Custom Integrated Circuits Conference, 2003, 305-312 (8 pages).

Ross, Andrew, "Power Save Issues in WLAN", Silex Technology America, Inc., 2014, 1-35 (35 pages).

Siripon, N., et al., "Novel Sub-Harmonic Injection-Locked Balanced Oscillator", Microwave and Systems Research Group (MSRG), School of Electronics, Computing and Mathematics, University of Surrey, 31st European Microwave Conference, Sep. 24, 2011, 1-4 (4 pages.

Testi, Nicolo, et al., "A 2.4GHz 72dB-Variable-Gain 100dB-DR 7.8mW 4th-Order tunable Q-Enhanced LC Band-Pass Filter.", IEEE Radio Frequency Integrated Circuits Symposium (RFIC), 2015, 87-90 (4 pages).

Tiebout, Marc, "A 50GHz Direct Injection Locked Oscillator Topology as Low Power Frequency Divider in 0.13 μm CMOS", Infineon Technologies AG, Solid-State Circuits Conference, 29th European ESSCIRC, 2003, 1-4 (4 pages).

Tsai, Pei-Kang, et al., "Wideband Injection-Locked Divide-by-3 Frequency Divider Design with Regenerative Second-Harmonic Feedback Technique", Wideband Injection-Locked Divide-by-3 Frequency Divider Design with Regenerative Second-Harmonic Feedback Technique, Mar. 21, 2013, 1-4 (4 pages).

US Navy, "Electronic Warfare and Radar Systems Engineering Handbook", Naval Air Systems Command and Naval Air Warfare Center, USA, Mixers and Frequency Discriminators, Section 6-8.1 to 6-8.2, Apr. 1, 1999, 1-299 (299 pages).

Winoto, Renaldi, et al., "A 2×2 WLAN and Bluetooth Combo SoC in 28nm CMOS with On-Chip WLAN Digital Power Amplifier, Integrated 2G/BT SP3T Switch and BT Pulling Cancelation", IEEE International Solid-State Circuits Conference, ISSCC 2016, Session 9.4, High-Performance Wireless, Feb. 2, 2016, 170-172 (3 pages).

* cited by examiner

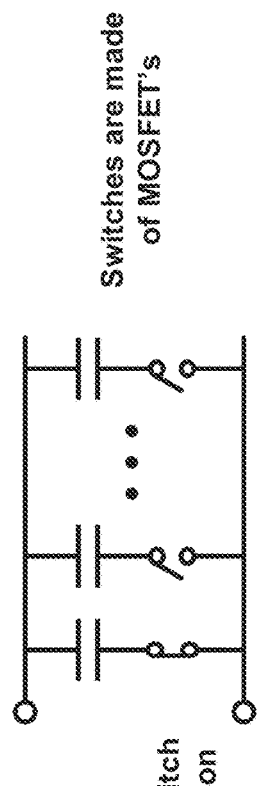
FIG. 7 Capacitor/Switch Implementation — Switches are made of MOSFET's
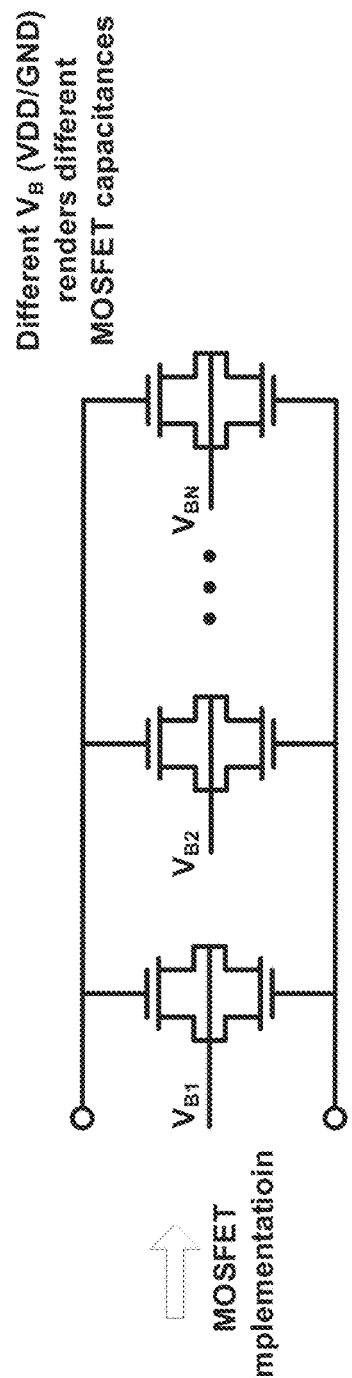
FIG. 8 MOSFET Implementation — Different $V_B$ (VDD/GND) renders different MOSFET capacitances
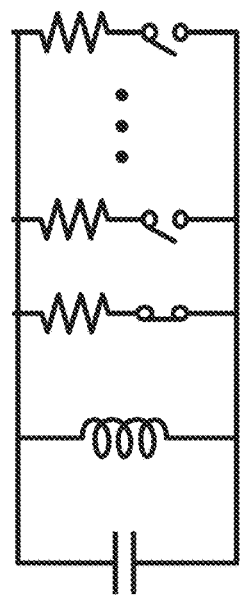
FIG. 9 Resistor/Switch Implementation
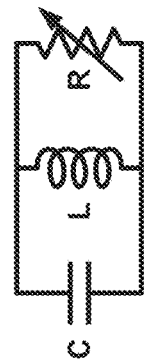
$Q = \omega_0 CR$
$Q = R/(\omega_0 L)$

MULTI-STAGE LNA WITH REDUCED MUTUAL COUPLING

CROSS-REFERENCE TO RELATED APPLICATIONS

This present application is a Continuation of U.S. application Ser. No. 16/125,480, filed Sep. 7, 2018, entitled "MULTI-STAGE LNA WITH REDUCED MUTUAL COUPLING," which is hereby incorporated by reference in its entirety.

BACKGROUND OF THE INVENTION

Low Noise Amplifiers are circuits for amplifying weak signals such as those received from antennas. It is important that they not introduce much noise given the weak power levels of the received signal. Otherwise, the signal to noise ratio (SNR) of the signal would be unacceptable for data recovery. The effect of the injected noise may be reduced by the gain of the LNA. As such, there is a need for improved LNAs, including those for use in direct conversion transceivers.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

FIGS. 7 and 8 are implementations of capacitor banks in accordance with some embodiments.

FIG. 9 is an implementation of a resistor bank in accordance with some embodiments.

Figure 1:
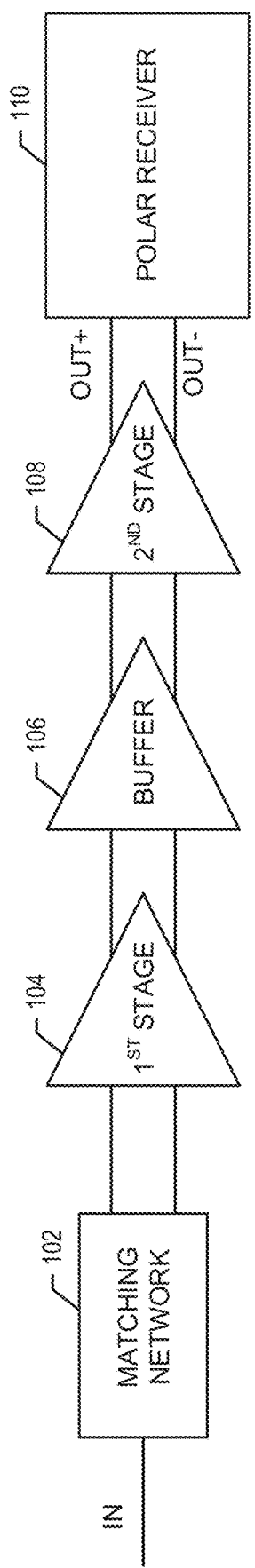
FIG. 1 is a block diagram of a LNA architecture in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Figure 6:
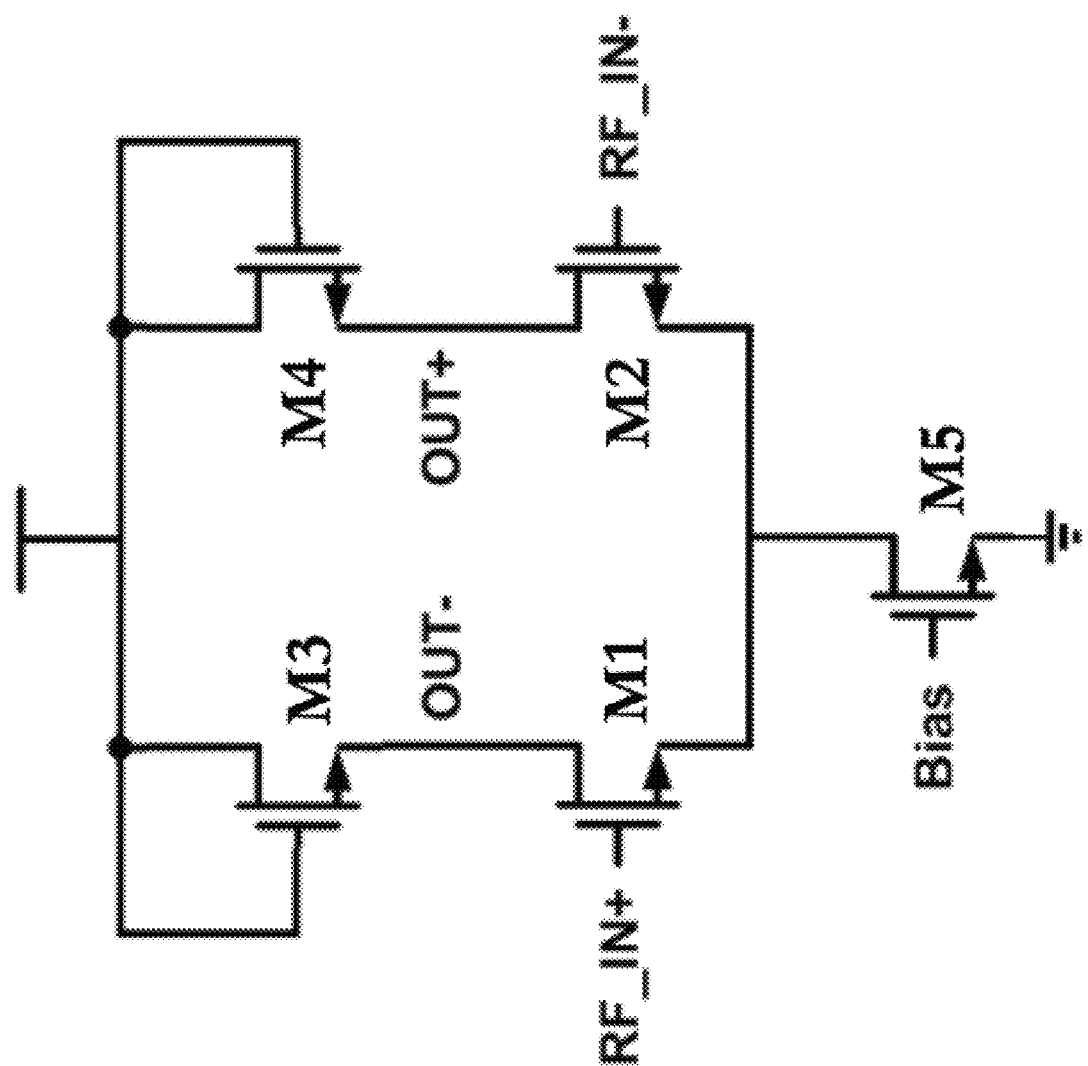
FIG. 6 is a circuit diagram of a buffer in accordance with some embodiments.

With reference to FIG. 1, an embodiment of a low noise amplifier in accordance with some embodiments will be described. A received signal, such as from an antenna, is received by the matching network 102. The output of the matching network is provided to the first LNA stage 104, the output of which is connected via buffer 106 to the second LNA stage 108. The buffer circuit is depicted in FIG. 6.

The output of the cascaded LNA stages is further processed in a receiver, such as a polar receiver 110. Additional details of the polar receiver may be found in the application U.S. application Ser. No. 16/840,478, now U.S. Pat. No. 8,929,486, filed Mar. 15, 2013, entitled POLAR RECEIVER ARCHITECTURE AND SIGNAL PROCESSING METHODS. Other well-known receiver architectures may also be used. Each stage of the two LNA stages 104, 108 may be tuned to exhibit a bandpass response. The two center frequencies, one from each stage, may be offset to provide an overall wider frequency bandwidth, yet still providing a high degree of off-band selectivity so as to reject adjacent channels.

Figure 2:
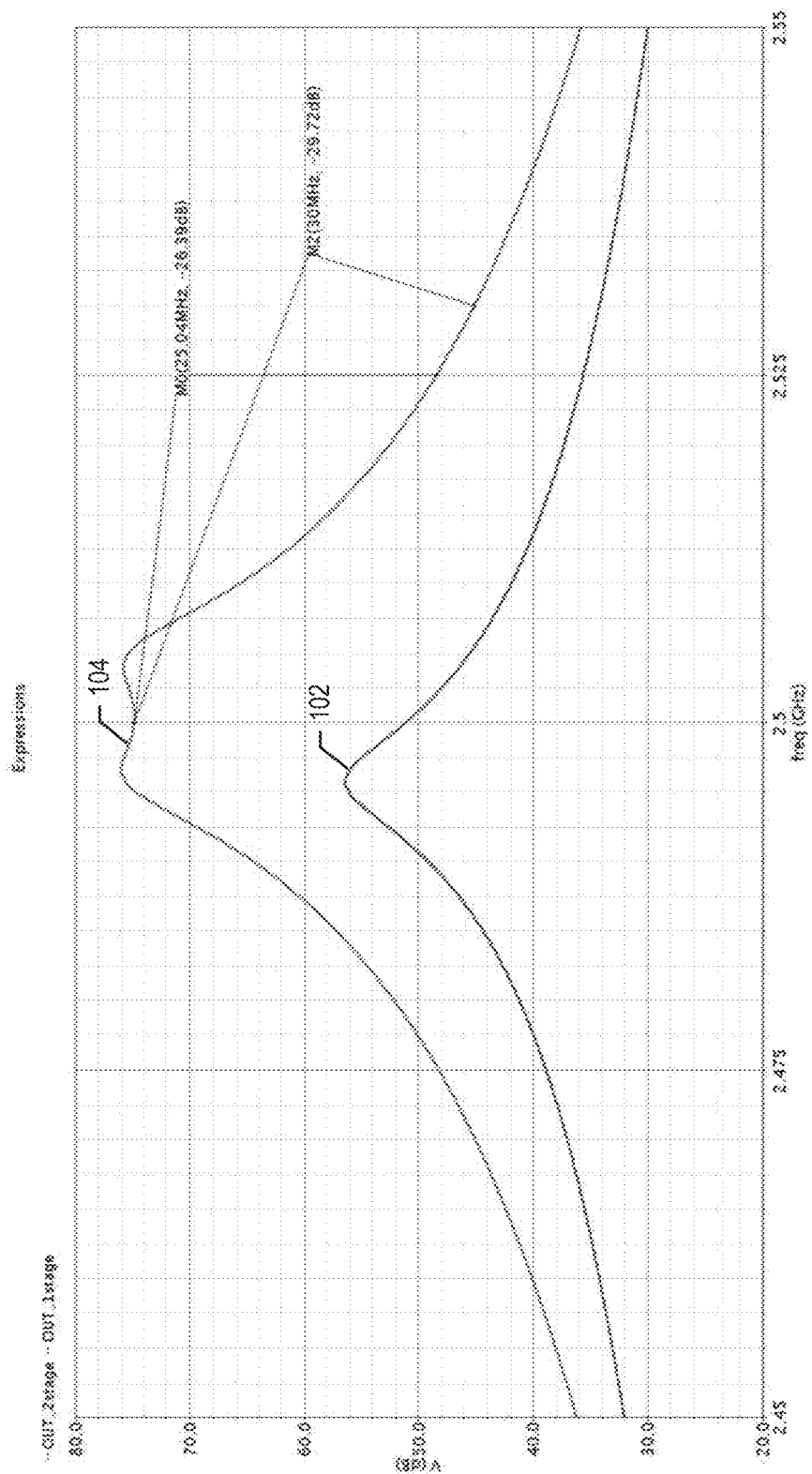
FIG. 2 is a plot of the frequency response of LNAs in accordance with some embodiments.

With reference to FIG. 2, the frequency response of the first stage is shown in plot 102, while the aggregated response of the frequency-staggered stages is shown in plot 104.

Figure 3:
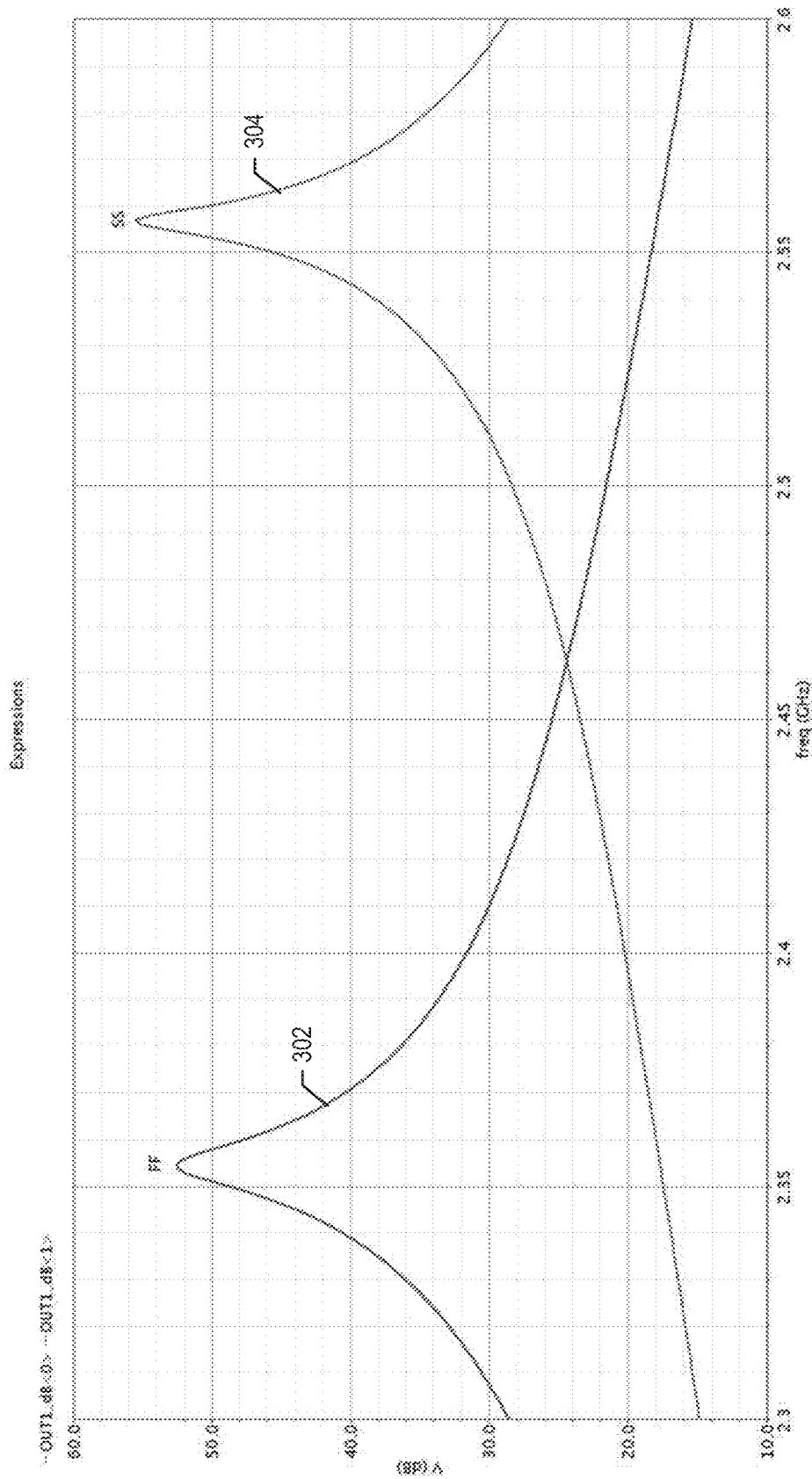
FIG. 3 is a block diagram of a configurable LNA frequency tuning in accordance with some embodiments.

With reference to FIG. 3, plots 302 and 304 both represent the response of the first stage. FIG. 3 shows that the center frequency of the filter may be tuned across the desired frequency band in the worst process corners.

Figure 4:
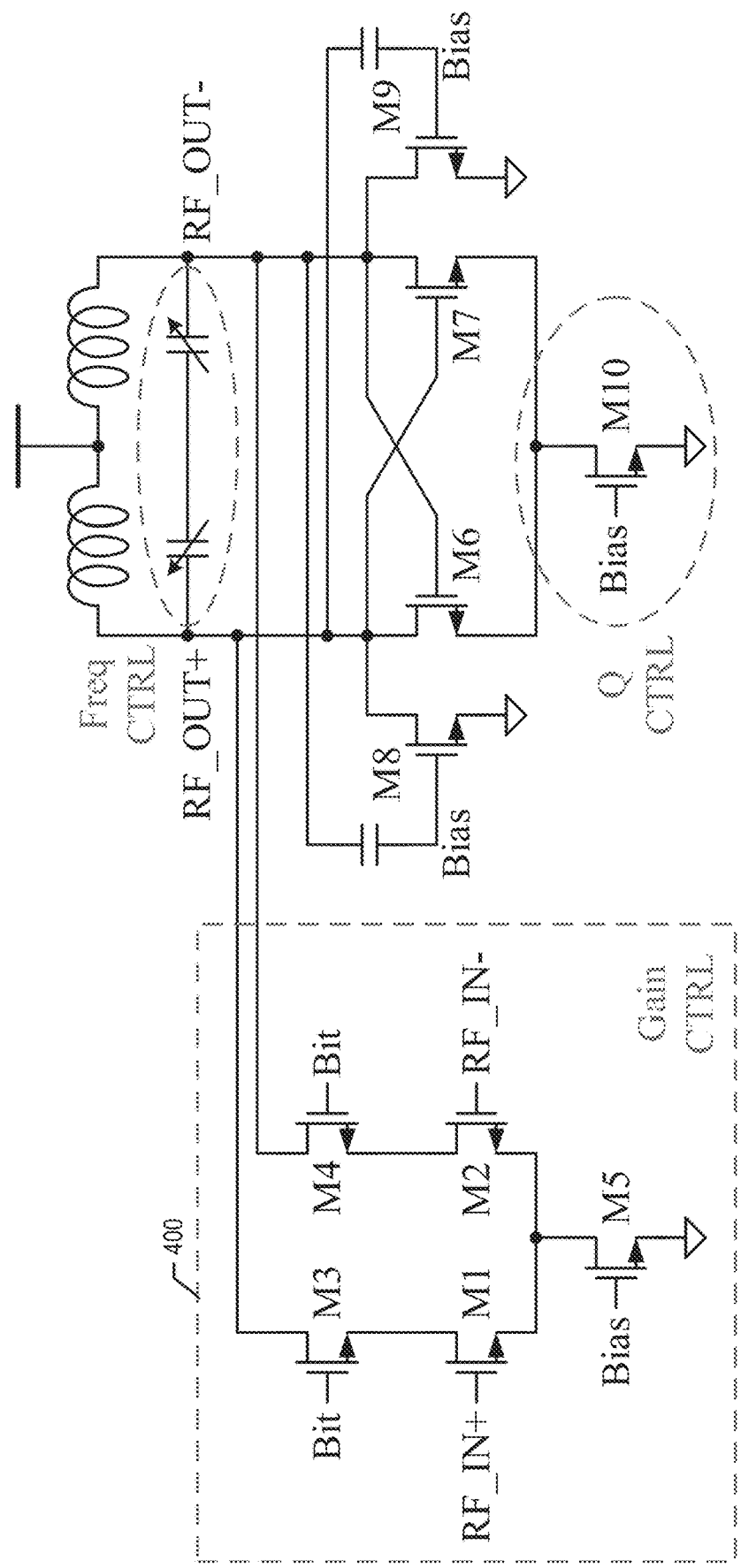
FIG. 4 is a circuit diagram of one embodiment of an adjustable LNA stage in accordance with some embodiments.

With reference to FIG. 4, the tunable LNA stage is depicted. The variable gain stage including the differential pair M1, M2, and the control FETs M3, M4 controlled by a Bit signal from the controller, is configured to provide a variable transconductance gain to drive the bandpass filter load. The LNA stage may include a plurality of switchable transconductance cells such as those shown in FIG. 5. The controller may use a binary code to adjust the gain, wherein each cell provides twice the gain of the prior cell. In addition, or as an alternative, some or all of the gain stage cells may provide equal amounts of gain, and may be controlled by a thermometer code control signal.

Again with respect to FIG. 4, the bandpass filter acting as the load for the transconductance gain stage includes an adjustable, or tunable tank circuit with frequency control (Freq CTRL). The tank circuit may be an LC tank as shown, or may alternatively be an RC tank circuit. The adjustable capacitors may take the form of a capacitor bank, such as that depicted in FIGS. 7 and 8. Each capacitor may be controlled individually by using a separate bit to control its corresponding switch. The capacitors in the capacitor bank may take the same value or different values such that each bit controls a capacitance cell having a proportionally larger amount of capacitance. Capacitance variations may be accomplished by using varying configurations of serially connected and/or parallel connected capacitors, by using different device sizes, or by using different bias voltages, as just a few examples of embodiments of a capacitance bank.

The bandpass filter also include cross-coupled transistors M6, M7 to complete the bandpass load. Note the cross-coupled compensation transistor pair M8, M9. These cross-coupled compensation transistors are biased in a sub-threshold region.

In small signal analysis the two currents flowing into M6 (I1) and M8 (I2) can be written as:

$$I1 = gm_{M6,1} \cdot V_{RF\_OUT-} + gm_{M6,2} \cdot V_{RF\_OUT-}^2 + gm_{M6,3} \cdot V_{RF\_OUT-}^3,$$

$$I2 = gm_{M8,1} \cdot V_{RF\_OUT-} + gm_{M8,2} \cdot V_{RF\_OUT-}^2 + gm_{M8,3} \cdot V_{RF\_OUT-}^3.$$

Where $gm_{M6,1}$, $gm_{M6,2}$, $gm_{M6,3}$, $gm_{M8,1}$, $gm_{M8,2}$ and $gm_{M8,3}$ are respectively the first, second and third terms in the Taylor expansion of the current for transistors M6 and M8. The first order term corresponds to the regular small signal gm. For a transistor biased in saturation, the third order term is negative. So if the amplitude of the input signal increases, the current starts to compress. On the contrary, for a transistor biased in the sub-threshold region, the third order term is positive. So if the amplitude of the input signal increases, the current increases accordingly. In FIGS. 4 M6 and M7 are biased in saturation, while M8 and M9 are in sub-threshold. So it is possible to have $gm_{M6,3} = -gm_{M8,3}$ using the proper transistor sizing and bias. In this way the total current in each branch results:

$$I_{tot} = I1 + I2 = (gm_{M6,1} + gm_{M8,1}) \cdot V_{in} + (gm_{M6,2} + gm_{M8,2}) \cdot V_{in}^2.$$

Because the signals applied to the two branches are differential, the second order term $(gm_{M6,2}\ gm_{M8,2}) \cdot V_{in}^2$ is canceled. In this way, the linear range of the cross-coupled transistor pair M6, M7 is extended by the cross-coupled compensation pair M8, M9.

The quality factor Q of the bandpass load may also be adjusted. In one embodiment, the bias on transistor M10 is adjusted. A very high Q may be used, even as high as 400 or 500, while still maintaining a linearized response from the bandpass load at high output swing (100 mVp). The high-Q tank, or bandpass load, presents a large resistance to the transconductance gain stage, which will therefore produce a large gain from a small current signal. Note also that the high Q provides narrow band selection and high rejection of adjacent bands or channels. The Q may also be reduced by selectively inserting resistances in the tank circuit under the control of the LNA control circuit. Such as resistor bank may be realized as depicted in FIG. 9.

Because the high quality factor Q becomes extremely sensitive to the value of transconductance of the cross-coupled pair, $-g_m/2$, small variations of gm may result in a large variation of Q. Thus, linearizing the transconductance of M6 and M7 with the insertion of the sub-threshold biased cross-coupled compensation transistor pair greatly increases the dynamic range of the LNA stages. Without this compensation, a decrease in the Q factor due to large output swing will reduce the gain and increase the response bandwidth, and result in less adjacent channel rejection.

Note also that while the addition of the cross-coupled compensation transistor pair may generate some additional noise, the compensation pair is part of the load, and any additional noise is relatively insignificant because it is not passing through the amplification stage. That is, the noise is injected at the output of the amplifier rather than the input, and thus has a minor impact, especially in a very high gain LNA.

Figure 10:
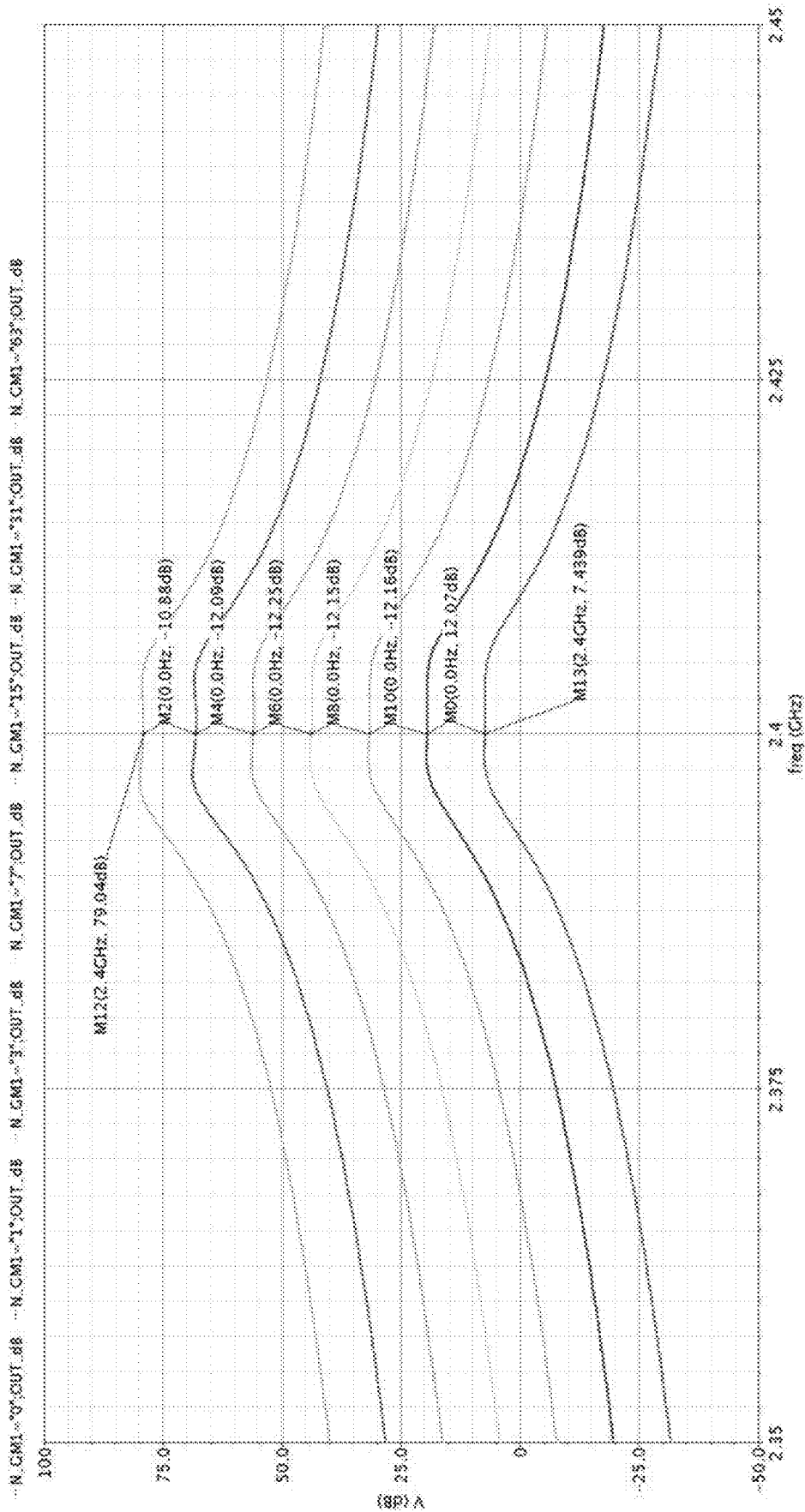
FIG. 10 is a plot of variable gain values in accordance with some embodiments.
Figure 11:
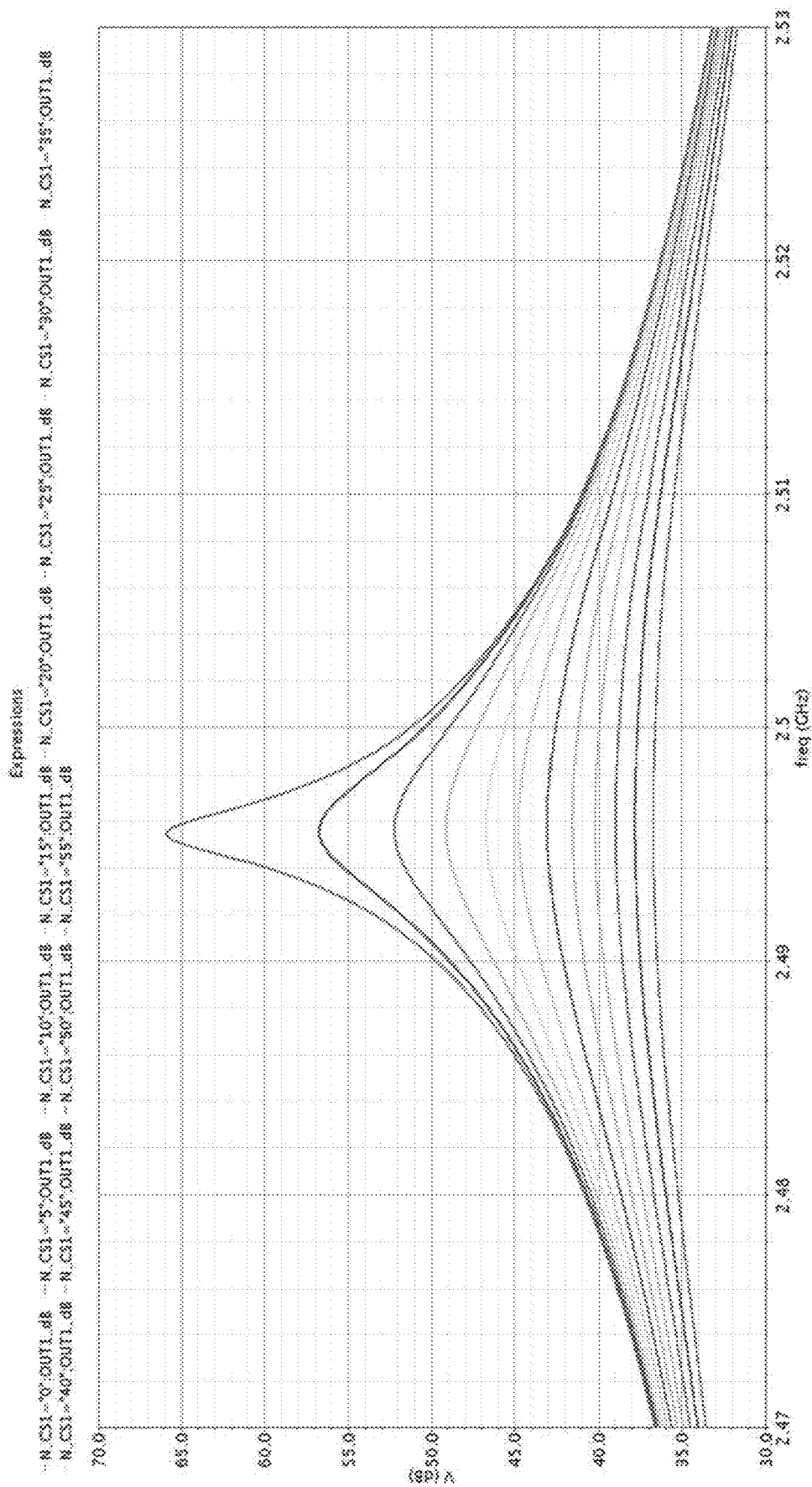
FIG. 11 is a signal plot showing Q values in accordance with some embodiments.
Figure 12:
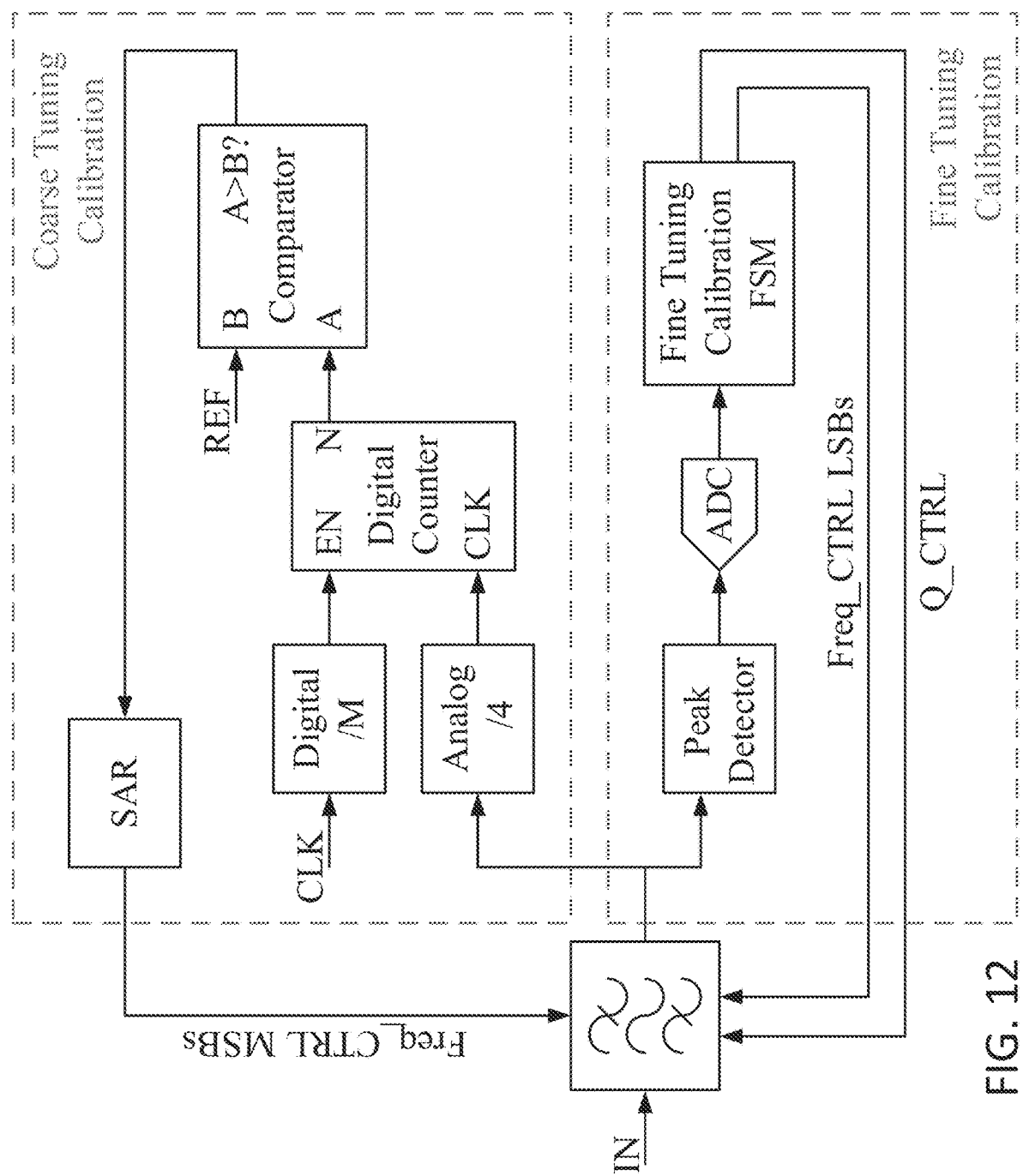
FIG. 12 is a control circuit configured to control the LNAs in accordance with some embodiments.

With reference to FIG. 10, some of the gain tuning steps are depicted. With reference to FIG. 11, some of the Q tuning steps are shown. One apparatus and method of controlling and/or calibrating the LNA stages is depicted in FIG. 12 in accordance with some embodiments.

The LNA controller 1200 may include a finite state machine to control the circuits and/or modules of the controller. The LNA may be driven to oscillation during one or more steps of the calibration. A frequency detector may comprise a digital divide by M to divide a clock signal, and an analog divide by 4 (or other number) circuit to reduce the frequency of the monitored oscillations from the LNA bandpass load in the form of an LC tank.

The LNA controller may be configured to provide a control output signal on the frequency control output line corresponding to the most significant bits from the coarse tuning circuit, and corresponding to the least significant bits from the fine tuning control circuit. These bits may be used to switch a capacitor bank to alter the resonant frequency of the bandpass load. In the coarse tuning mode, the Q of the LNA may be increased to point of causing the LNA to oscillate. The frequency at which the LNA resonates is related to the peak of the frequency response when not in oscillation. Thus, the oscillatory condition induced in the LNA may be used to coarsely adjust the tank circuit capacitance. In the fine tuning mode, the controller generates one or more tones and measures the amplitudes to determine both a 3 dB point (which measures the Q) as well as the frequency at which a peak output may be obtained, which corresponds to the center frequency of the bandpass filter. Other tones and measurements may also be used to determine a fine calibration of the LNA.

The control output may include multiple parallel bits for controlling the Q factor of the LNA stages. The LNA controller may responsively adjust the Q by altering a bias current in the bandpass load circuit.

Figure 5:
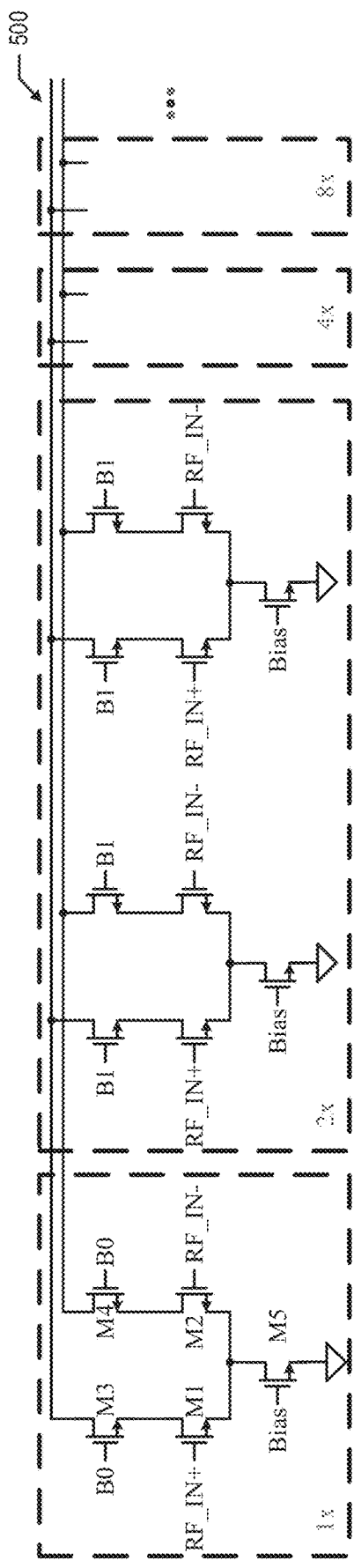
FIG. 5 is an implementation of cells used to provide digitally controlled variable gain in accordance with some embodiments.

With reference to LNA variable gain transconductance stage 400, the variable gain may be achieved by switching either ON or OFF additional transistor devices. One such variable transconductance stage is shown in FIG. 5. The gain control signal from the LNA controller may include numerous bits B0, B1, B2 etc. Control bit B0 may be used to control a first cell, control bit B1 may be used to control a second cell, and control bit B2 may be used to control a third cell. Note that the first, second and third cells each provide an increasing amount of transconductance amplification. The code may be referred to as a binary code in that each bit controls an amplification of twice the prior stage. In an alternative embodiment, each cell may add the same amount of gain, in which case the binary control word may be referred to as a thermometer code.

In one embodiment, the apparatus comprises a variable gain amplifier stage configured to accept an input signal and to provide a load driving signal, a tunable bandpass filter connected as a load to the variable gain amplifier stage, and a controller circuit configured to tune the bandpass filter. The bandpass filter includes a resonant tank, a cross-coupled transistor pair, and at least one cross-coupled compensation transistor pair biased in a subthreshold region. That compensation configuration adds a transconductance component when the load driving signal is of a magnitude large enough to decrease the transconductance of the cross-coupled transistor pair. Further, it may include a controller circuit configured to tune the bandpass filter. The bandpass filter may comprise a capacitor bank, and the controller circuit may be configured to adjust the capacitor bank to alter the center frequency of the bandpass filter. The controller circuit may be configured to alter a bias point of the cross-coupled transistors to vary the Q of the tank, to induce an oscillation in the bandpass filter, to measure the resonant frequency of the oscillation, and to adjust the resonant frequency of the bandpass filter. The variable gain stage amplifier may be a transconductance amplifier stage that has a plurality of parallel connected transconductance cells. In addition, the at least one cross-coupled compensation transistor pair may comprise a plurality of parallel-connected cross-coupled compensation transistor pairs. Each of the plurality of parallel-connected cross-coupled compensation transistor pairs may be biased at a different sub-threshold voltage. In an embodiment, a bias control circuit may be configured to adjust a sub-threshold bias voltage of the at least one cross-coupled compensation transistor pair. The control circuit may also be configured to adjust a quality factor Q of the first and second bandpass filters to obtain a desired adjacent channel rejection ratio.

Figure 13:
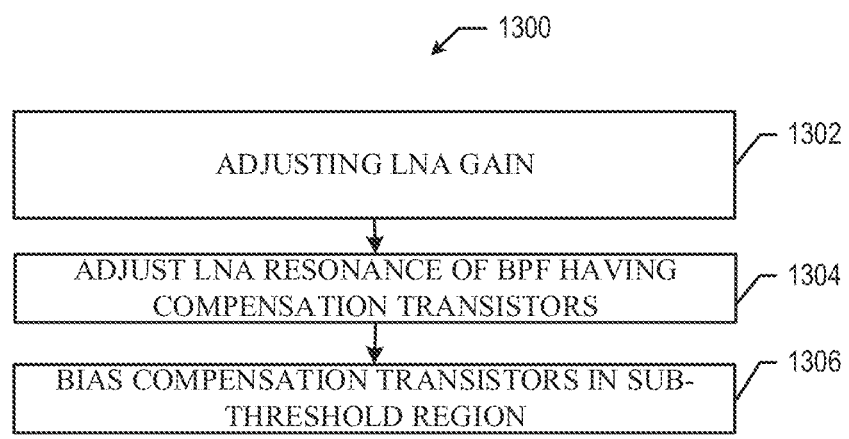
FIGS. 13 and 14 are flow charts depicting a method of LNA adjustment in accordance with some embodiments.

With reference to FIG. 13, a method will be described in accordance with some embodiments. A method 1300 may comprise: adjusting 1302 the gain of a variable gain amplifier stage; adjusting 1304 a resonant frequency and a Q of a tunable bandpass filter connected as a load to the variable gain amplifier stage; wherein the bandpass filter includes a cross-coupled transistor pair, and at least one cross-coupled compensation transistor pair; and 1306 biasing the at least one cross-coupled compensation transistor pair in subthreshold region. Note that the steps described do not require a specific sequence. In particular, as an example, the order may be reversed. A compensation may first be adjusted, then the resonant or center frequency and Q, and finally the gain. The method may include adjusting the resonant frequency of a tunable bandpass filter by adjusting a capacitor bank. In an embodiment, the method may further comprise adjusting a bias point of the cross-coupled transistors to induce an oscillation in the bandpass filter or resonant tank; measuring the resonant frequency of the oscillation; and, adjusting the resonant frequency of the bandpass filter. In an embodiment, the method may comprise adjusting a bias point of the cross-coupled transistors to tune the Q of the resonant tank. The method may include adjusting the gain of the variable gain stage amplifier by switching on or off a plurality of parallel connected transconductance cells. The at least one cross-coupled compensation transistor pair may comprise a plurality of parallel-connected cross-coupled compensation transistor pairs, and the method may further comprise setting the bias voltage at a different subthreshold voltage for each of the plurality of parallel-connected cross-coupled compensation transistor pairs. The method may also comprise adjusting a sub-threshold bias voltage of the at least one cross-coupled compensation transistor pair.

Figure 14:
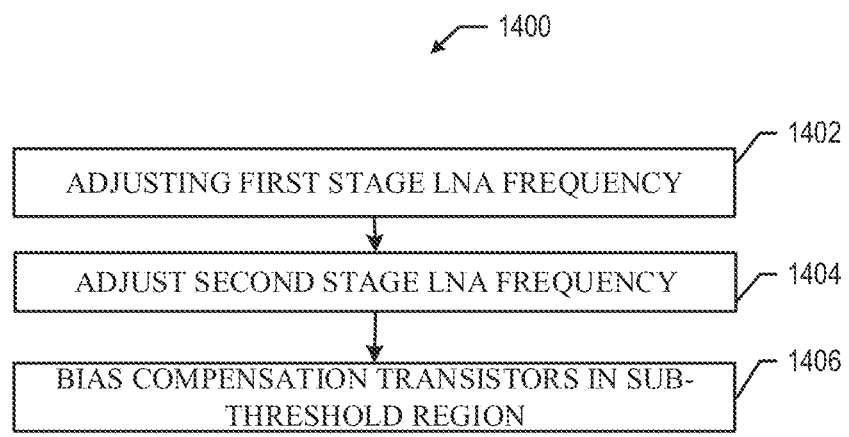

An additional method 1400 of FIG. 14 may comprise adjusting 1402, to a first frequency, a resonant frequency of a first low noise amplifier stage having a first variable gain amplifier stage and a first tunable bandpass filter; adjusting 1404, to a second frequency offset from the first frequency, a resonant frequency of a second low noise amplifier stage having a second variable gain amplifier stage and a second tunable bandpass filter; and, biasing 1406 cross-coupled compensation transistor pairs in each of the first tunable bandpass filter and second tunable bandpass filter in a sub-threshold region to provide a compensation transconductance in the presence of large signals. Again, the order of steps presented is not limiting. The method 1400 may be performed by first biasing the compensation transistors. The frequency and Q of the LNA stages may then be adjusted. The first frequency and second frequency may be selected in accordance with a desired channel frequency. The quality factor Q of the first and second bandpass filters may be adjusted to obtain a desired adjacent channel rejection ratio. The adjusting steps of the first and second bandpass filter resonant frequencies may comprise adjusting a bias point of the cross-coupled transistors to induce an oscillation in the respective bandpass filter; measuring the resonant frequency of the oscillation; and, adjusting the resonant frequency of the respective bandpass filter.

Figure 15:
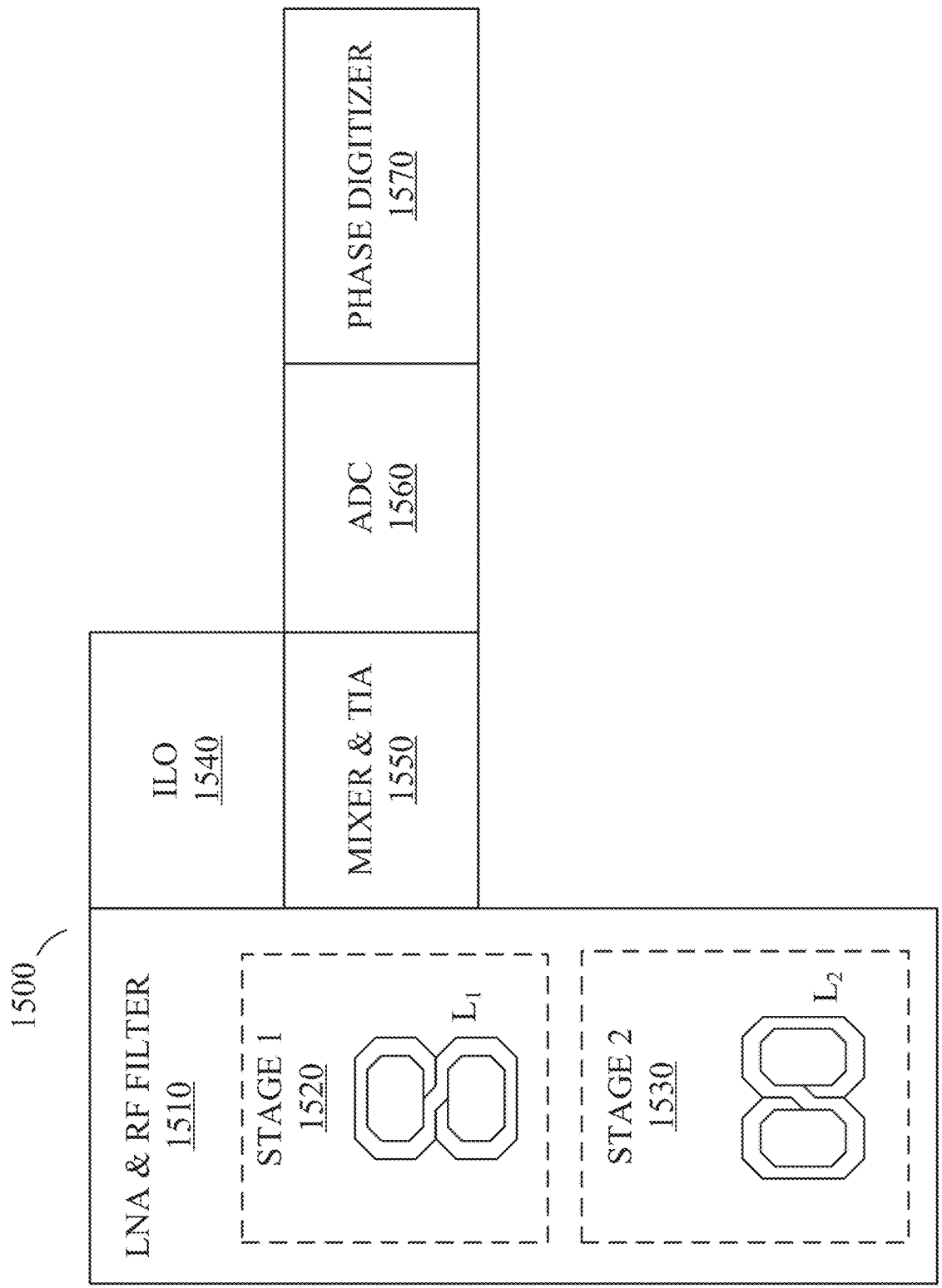
FIG. 15 is a block diagram of a LNA architecture in accordance with some embodiments.

Referring now to FIG. 15, in one embodiment the apparatus 1500 comprises at least two variable gain amplifier stages, each configured to accept an input signal and to provide a load driving signal, each stage can include a tunable bandpass filter connected as a load to each variable gain amplifier stage. In one embodiment, the apparatus includes a tunable bandpass filter connected as a load to each variable gain amplifier stage, wherein each bandpass filter includes a resonant tank, each resonant tank including an inductor, wherein each inductor of each resonant tank is oriented in orthogonal relation with respect to each longitudinal axis of each next inductor, the orthogonal relation of the respective longitudinal axes configured to reduce mutual coupling between the at least two tunable bandpass filters.

One method of reducing such coupling is to subdivide each inductive coil into two series-connected sub-coils that are wound in opposite directions, e.g. clockwise and counter-clockwise for a planar embodiment. Following conventional practice, each sub-coil may be comprised of one or more metallization layers each having one or more turns. In some embodiments, the multiple turns on a given metallization layer are configured in a helical pattern. In at least one embodiment, the two sub-coils are adjacently located as in a figure '8', thus the term 'figure-8 patterned inductor' will be subsequently used to describe any such combination of two sub-coils, without implying limitation.

More specifically, as shown in FIG. 15, the apparatus can include an LNA and RF filter 1510 including a stage 1 tunable bandpass filter 1520 with an LC resonant tank shown with a figure-8 patterned inductor, and a stage 2 tunable bandpass filter 1530 with an LC resonant tank also shown with a figure-8 patterned inductor. As shown, the figure-8 patterned inductors are in an orthogonal relation. Specifically, the inductors, one in each stage, are oriented in orthogonal relation with respect to each longitudinal axis of each next inductor, the orthogonal relation of the respective longitudinal axes are configured to reduce mutual coupling between tunable bandpass filters and between stages.

Also shown is injection locked oscillator 1540 and mixer with transinductance amplifier 1550. Also shown is analog to digital converter (ADC) 1560 and phase digitizer 1570.

Figure 16:
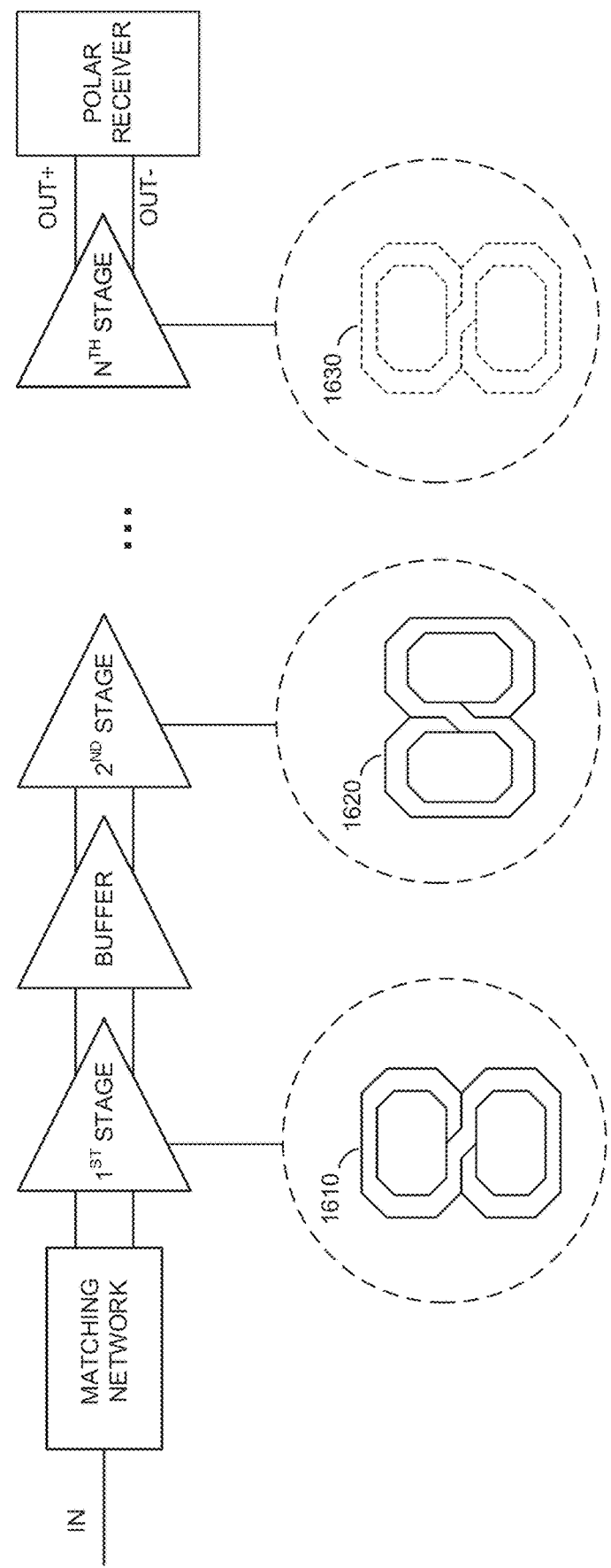
FIG. 16 is another block diagram of a LNA architecture in accordance with some embodiments.

Referring to FIG. 16, to further emphasize the reduction of mutual coupling between stages, stage 1 1610, stage 2 1620 and stage N 1630 are shown similar to the stages shown in FIG. 1. As shown the inductors within each tunable bandpass filter is shown according to an embodiment. Stage 1 illustrates a figure-8 patterned inductor and stage 2 illustrates an orthogonally displaced figure-8 patterned inductor. In one embodiment, the stages can include multiple stages wherein a next inductor would be orthogonal to a prior inductor. Thus, if there were a third stage, the tunable bandpass filter would include an inductor in orthogonal relation to the second stage.

In one embodiment, each inductor of each resonant tank is located on a same plane. For example, a manufacturing die could be designed to enable a plane of tunable bandpass filters including inductors aligned on a same plane.

As shown in both FIGS. 15 and 16, each inductor is formed in a figure-8 type pattern with longitudinal axes defining respective lengths of each inductor. In other embodiments, the inductors can have longitudinal axis defined in a figure-8 pattern or a longitudinal axis defined another pattern, as one of ordinary skill in the art with benefit of this disclosure would appreciate.

In one embodiment, the apparatus further includes a cross-coupled transistor pair, and at least one cross-coupled compensation transistor pair biased in a subthreshold region configured to add a transconductance component as a function of a load-driving signal.

In an embodiment, the compensation configuration adds a transconductance component when the load-driving signal is of a magnitude large enough to decrease the transconductance of the cross-coupled transistor pair. Further, it may include a controller circuit configured to tune the bandpass filter. Each bandpass filter may comprise a capacitor bank, and the controller circuit may be configured to adjust the capacitor bank to alter the center frequency of the bandpass filter. The controller circuit may be configured to alter a bias point of the cross-coupled transistors to vary the Q of the tank, to induce an oscillation in the bandpass filter, to measure the resonant frequency of the oscillation, and to adjust the resonant frequency of the bandpass filter. The variable gain stage amplifier may be a transconductance amplifier stage that has a plurality of parallel connected transconductance cells. In addition, the at least one cross-coupled compensation transistor pair may comprise a plurality of parallel-connected cross-coupled compensation transistor pairs. Each of the plurality of parallel-connected cross-coupled compensation transistor pairs may be biased at a different sub-threshold voltage. In an embodiment, a bias control circuit may be configured to adjust a sub-threshold bias voltage of the at least one cross-coupled compensation transistor pair. The control circuit may also be configured to adjust a quality factor Q of the first and second bandpass filters to obtain a desired adjacent channel rejection ratio.

Accordingly, some embodiment of an apparatus includes at least two variable gain amplifier stages, each variable gain amplifier configured to accept an input signal and to provide a load driving signal, a tunable bandpass filter connected as a load to each variable gain amplifier stage, wherein each bandpass filter includes a resonant tank, each resonant tank including an inductor, wherein each inductor of each resonant tank is oriented in orthogonal relation with respect to each respective longitudinal axis of each next inductor, the orthogonal relation of the respective longitudinal axes configured to reduce mutual coupling between the tunable bandpass filters, a cross-coupled transistor pair, and at least one cross-coupled compensation transistor pair biased in a subthreshold region configured to add a transconductance component as a function of a load driving signal, and, a controller circuit configured to tune each tunable bandpass filter.

In some embodiments, each inductor of each resonant tank is located on a same plane.

In some embodiments, each inductor is formed in a figure-8 type pattern, the longitudinal axes defining respective lengths of each inductor.

In some embodiments, each tunable bandpass filter includes a capacitor bank, and the controller circuit is configured to adjust the capacitor bank to alter the frequency response of each tunable bandpass filter.

In some embodiments, the controller circuit is configured to alter a bias point of the cross-coupled transistors to induce an oscillation in each tunable bandpass filter, to measure the resonant frequency of the oscillation, and to adjust the resonant frequency of each tunable bandpass filter.

In some embodiment, each variable gain stage amplifier is a transconductance amplifier stage have a plurality of parallel connected transconductance cells.

In one embodiment, the at least one cross-coupled compensation transistor pair comprises a plurality of parallel-connected cross-coupled compensation transistor pairs.

In some embodiments, the at least two variable gain amplifier stages includes a first low noise amplifier stage tuned to a first frequency and a second low noise amplifier stage having a second variable gain amplifier stage, the second low noise amplifier stage tuned to a second frequency and connected serially with the first low noise amplifier stage.

In some embodiments the first frequency and second frequency are selected in accordance with a desired channel frequency.

A method according to some embodiments includes adjusting the gain of at least two variable gain amplifier stages; adjusting a resonant frequency and a Q of each tunable bandpass filter connected as a load to the at least two variable gain amplifier stages, wherein each bandpass filter includes a cross-coupled transistor pair, and at least one cross-coupled compensation transistor pair and a resistor tank, each resonant tank including an inductor, wherein each inductor of each resonant tank is oriented in orthogonal relation with respect to each respective longitudinal axis of each next inductor, the orthogonal relation of the respective longitudinal axes configured to reduce mutual coupling between the tunable bandpass filters; and, biasing the at least one cross-coupled compensation transistor pair in a sub-threshold region.

In some embodiments, the method includes adjusting a bias point of the cross-coupled transistors to induce an oscillation in each bandpass filter; measuring a resonant frequency of the respective oscillation; and, adjusting a respective resonant frequency of each bandpass filter.

In some embodiments, the method includes adjusting a bias point of the cross coupled transistors to adjust the Q in each bandpass filter.

Another method according to some embodiments includes adjusting, to a first frequency, a resonant frequency of a first low noise amplifier stage having a first variable gain amplifier stage and a first tunable bandpass filter; adjusting, to a second frequency offset from the first frequency, a resonant frequency of a second low noise amplifier stage having a second variable gain amplifier stage and a second tunable bandpass filter; biasing cross-coupled compensation transistor pairs in each of the first tunable bandpass filter and second tunable bandpass filter in a sub-threshold region; and orienting the first and second tunable bandpass filters to reduce mutual coupling by providing a resonant tank within each of the first and second tunable bandpass filters with an inductor, wherein each inductor of each resonant tank is oriented in orthogonal relation with respect to each respective longitudinal axis of each next inductor, the orthogonal relation of the respective longitudinal axes configured to reduce mutual coupling between the tunable bandpass filters.

In some embodiments the first frequency and second frequency are selected in accordance with a desired channel frequency.

In some embodiments, the method includes adjusting a quality factor Q of the first and second bandpass filters to obtain a desired overall bandwidth and adjacent channel rejection ratio.

In some embodiments, each of the adjusting steps of the first and second bandpass filter resonant frequencies includes adjusting a bias point of the cross-coupled transistors to induce an oscillation in the respective bandpass filter; measuring the resonant frequency of the oscillation; and, adjusting the resonant frequency of the respective bandpass filter.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Accordingly, some embodiments of the present disclosure, or portions thereof, may combine one or more processing devices with one or more software components (e.g., program code, firmware, resident software, micro-code, etc.) stored in a tangible computer-readable memory device, which in combination form a specifically configured apparatus that performs the functions as described herein. These combinations that form specially programmed devices may be generally referred to herein "modules". The software component portions of the modules may be written in any computer language and may be a portion of a monolithic code base, or may be developed in more discrete code portions such as is typical in object-oriented computer languages. In addition, the modules may be distributed across a plurality of computer platforms, servers, terminals, and the like. A given module may even be implemented such that separate processor devices and/or computing hardware platforms perform the described functions.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:
1. An apparatus comprising:
    at least two variable gain amplifier stages, each variable gain amplifier stage configured to accept an input signal and to provide a load driving signal;
    a tunable bandpass filter connected as a load to each variable gain amplifier stage, wherein each tunable bandpass filter includes:

a resonant tank, each resonant tank including an inductor, wherein each inductor of each resonant tank is oriented in orthogonal relation with respect to each respective longitudinal axis of each next inductor, the orthogonal relation of the respective longitudinal axes configured to reduce mutual coupling between the tunable bandpass filters, and at least one cross-coupled compensation transistor pair biased in a subthreshold region configured to add a transconductance component as a function of the respective load driving signal for the respective tunable bandpass filter;
and,
a controller circuit configured to tune each tunable bandpass filter.

2. The apparatus of claim 1, wherein each inductor of each resonant tank is located on a same plane.

3. The apparatus of claim 1, wherein each inductor is formed in a figure-8 type pattern, the longitudinal axes defining respective lengths of each inductor.

4. The apparatus of claim 1, wherein each tunable bandpass filter includes a capacitor bank, and the controller circuit is configured to adjust each capacitor bank to alter the frequency response of each tunable bandpass filter.

5. The apparatus of claim 1, wherein the controller circuit is configured to induce an oscillation in each tunable bandpass filter, to measure the resonant frequency of the oscillation, and to adjust the resonant frequency of each tunable bandpass filter.

6. The apparatus of claim 1, wherein each variable gain amplifier stage is a transconductance amplifier stage having a plurality of parallel connected transconductance cells.

7. The apparatus of claim 1, wherein each at least one cross-coupled compensation transistor pair comprises a plurality of parallel-connected cross-coupled compensation transistor pairs.

8. The apparatus of claim 1, including a first low noise amplifier stage that includes a first variable gain amplifier stage of the at least two variable gain amplifier stages and a first tunable bandpass filter of the tunable bandpass filters, and including a second low noise amplifier stage that includes a second variable gain amplifier stage of the at least two variable gain amplifier stages and a second tunable bandpass filter of the tunable bandpass filters wherein the first low noise amplifier stage is configured to be tuned to a first frequency and the second low noise amplifier stage is configured to be tuned to a second frequency and wherein the second low noise amplifier stage is connected serially with the first low noise amplifier stage.

9. The apparatus of claim 8, wherein the first frequency and second frequency are selected in accordance with a desired channel frequency.

10. A method comprising:
adjusting the gain of at least two variable gain amplifier stages;
adjusting a resonant frequency and a quality factor (Q) of at least two tunable bandpass filters respectively connected as respective loads to the at least two variable gain amplifier stages, wherein each tunable bandpass filter of the at least two tunable bandpass filters includes at least one cross-coupled compensation transistor pair, and a resonant tank, each resonant tank including an inductor, wherein each inductor of each resonant tank is oriented in orthogonal relation with respect to each respective longitudinal axis of each next inductor, the orthogonal relation of the respective longitudinal axes configured to reduce mutual coupling between the at least two tunable bandpass filters; and,
biasing the respective at least one cross-coupled compensation transistor pair in a subthreshold region.

11. The method of claim 10, further comprising:
inducing an oscillation in each tunable bandpass filter;
measuring a resonant frequency of the respective oscillation; and,
adjusting a respective resonant frequency of each tunable bandpass filter.

12. The method of claim 10, further comprising adjusting the Q in each tunable bandpass filter to obtain a desired overall bandwidth and adjacent channel rejection ratio.

13. A method comprising:
adjusting, to a first frequency, a resonant frequency of a first low noise amplifier stage having a first variable gain amplifier stage and a first tunable bandpass filter;
adjusting, to a second frequency offset from the first frequency, a resonant frequency of a second low noise amplifier stage having a second variable gain amplifier stage and a second tunable bandpass filter, wherein the first and second tunable bandpass filters include respective resonant tanks, each respective resonant tank including a respective inductor, wherein each inductor of each resonant tank is oriented in orthogonal relation with respect to each respective longitudinal axis of each next inductor, the orthogonal relation of the respective longitudinal axes configured to reduce mutual coupling between the first and second tunable bandpass filters;
biasing cross-coupled compensation transistor pairs in each of the first tunable bandpass filter and second tunable bandpass filter in a sub-threshold region.

14. The method of claim 13, wherein the first frequency and second frequency are selected in accordance with a desired channel frequency.

15. The method of claim 13, further comprising adjusting a quality factor (Q) of the first and second tunable bandpass filters of the first and second low noise amplifier stages to obtain a desired overall bandwidth and adjacent channel rejection ratio.

16. The method of claim 13, wherein adjusting the respective resonant frequencies of the first and second low noise amplifier stages respectively comprises:
inducing an oscillation in the respective tunable bandpass filter;
measuring the resonant frequency of the respective oscillation; and,
adjusting the resonant frequency of the respective tunable bandpass filter.

* * * * *